(12) United States Patent
Takahashi et al.

(10) Patent No.: US 8,145,152 B2
(45) Date of Patent: Mar. 27, 2012

(54) GAIN TEMPERATURE COMPENSATION CIRCUIT

(75) Inventors: Kiyotaka Takahashi, Kawasaki (JP); Yasushi Seino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 615 days.

(21) Appl. No.: 12/342,433

(22) Filed: Dec. 23, 2008

(65) Prior Publication Data

US 2009/0291651 A1 Nov. 26, 2009

(30) Foreign Application Priority Data

May 22, 2008 (JP) ................................. 2008-133906

(51) Int. Cl.
*H03C 1/62* (2006.01)
(52) U.S. Cl. .................. 455/115.1; 455/127.2
(58) Field of Classification Search ............... 455/115.1, 455/127.2
See application file for complete search history.

(56) References Cited

U.S. PATENT DOCUMENTS

| 4,034,313 | A |   | 7/1977  | Jones et al.     |         |
|-----------|---|---|---------|------------------|---------|
| 5,659,253 | A | * | 8/1997  | Busking          | 324/648 |
| 5,701,595 | A | * | 12/1997 | Green, Jr.       | 455/83  |
| 6,374,087 | B1| * | 4/2002  | Gressent et al.  | 455/78  |
| 6,472,949 | B1| * | 10/2002 | Yamazaki et al.  | 333/81 R|
| 6,693,394 | B1| * | 2/2004  | Guo et al.       | 315/291 |
| 7,068,985 | B2| * | 6/2006  | Quilisch et al.  | 455/127.2 |
| 2005/0170794 | A1 | | 8/2005 | Koukkari et al. |         |

FOREIGN PATENT DOCUMENTS

| EP | 1 432 121    | 6/2004  |
| JP | 53-113459    | 10/1978 |
| JP | 10-341112    | 12/1998 |
| JP | 200031746    | 1/2000  |
| JP | 2007520129   | 7/2007  |
| JP | 2007-192699  | 8/2007  |

OTHER PUBLICATIONS

European Search Report dated Jun. 8, 2009, from the corresponding European Application.
Notification of Reason for Rejection dated Dec. 6, from the corresponding Japanese Application No. 2008-133906, with partial English translation attached.

* cited by examiner

*Primary Examiner* — Khai M Nguyen
(74) *Attorney, Agent, or Firm* — Katten Muchin Rosenman LLP

(57) ABSTRACT

A gain temperature compensation circuit producing a relatively small loss of power, and enabling modification of a variation width of the attenuation amount in a predetermined temperature range is provided. A gain temperature compensation circuit includes a circulator and a thermistor. The circulator outputs a signal being input to a first port to a second port, and outputs the signal being input to the second port to a third port. The thermistor being connected to the second port reflects the signal being output from the second port by varying the power of the signal according to temperature, so as to input to the second port, in order to adjust the attenuation amount of the signal.

3 Claims, 6 Drawing Sheets

(1), (2)  Input/output terminals (3)  Ground terminal

GAIN TEMPERATURE COMPENSATION CIRCUIT

CROSS-REFERENCE TO RELATED APPLICATIONS

This application is based upon and claims the benefit of priority from the prior Japanese Patent Application No. 2008-133906, filed on May 22, 2008, the entire contents of which are incorporated herein by reference.

FIELD

The present invention relates to a gain temperature compensation circuit varying a signal gain according to temperature, which is particularly appropriate for adjusting a signal gain to be input to a high output amplifier of a radio transmission apparatus.

BACKGROUND

For example, in a radio communication system, a radio transmission apparatus for transmitting a radio signal amplifies a high frequency signal by a high output amplifier (power amplifier), so as to transmit from an antenna. The power amplifier has a gain characteristic which varies with temperature, and is decreased as the temperature becomes high. Therefore, in order to maintain a constant signal gain irrespective of a thermal change, the signal gain being input to the power amplifier is adjusted by a gain temperature compensation circuit, and thereby temperature compensation is performed.

FIG. 1 is a diagram illustrating an exemplary configuration of the conventional gain temperature compensation circuit. FIG. 1A is an exemplary circuit configuration, and FIG. 1B is a diagram illustrating the attenuation amount characteristic thereof. As shown in FIG. 1A, the gain temperature compensation circuit has a configuration in which a thermistor, of which impedance varies with temperature, is connected to a resistance element having a fixed impedance. For example, in the circuit configuration shown in FIG. 1A, by appropriately modifying the resistance value, it is possible to design to obtain a desired compensation value of the attenuation amount (gain) relative to a temperature change in a predetermined temperature range (for example, from −40° C. to 100° C.).

The following patent document 1 describes a method for compensating the temperature characteristic of a solid amplifier by varying the reference voltage of an error amplifier according to a varied resistance value of a thermistor.

[Patent document 1] The official gazette of the Japanese Unexamined Patent Publication No. Sho-53-113459.

However, in the conventional gain temperature compensation circuit, when it is intended to secure a constant amount (10 dB, for example) of a variation width (thermal inclination) of the attenuation amount (gain) in a predetermined temperature range, there is a problem that the attenuation amount at a normal temperature (in the vicinity of 25° C.) becomes relatively large, and accordingly, a large loss of power is produced. For example, in FIG. 1B, the attenuation amount at the normal temperature (in the vicinity of 25° C.) becomes on the order of approximately 10 dB, and also, a minimum attenuation amount (at 100° C.) becomes approximately 6 dB.

Further, since the conventional gain temperature compensation circuit is integrated into a chip, if it is desired to modify the thermal inclination of the attenuation amount in a predetermined temperature range, it is necessary to change the overall components in the gain temperature compensation circuit.

There is a known means for controlling the attenuation amount by voltage control. However, because the voltage control according to temperature is required, there are defects that the circuit becomes large in scale, and that a power supply for the control becomes necessary.

SUMMARY

Accordingly, it is an object of the present invention to provide a gain temperature compensation circuit producing a relatively small loss of power, and enabling modification of a variation width of the attenuation amount in a predetermined temperature range.

To achieve the above-described object, a gain temperature compensation circuit includes: a circulator outputting a signal being input to a first port to a second port, and outputting the signal being input to the second port to a third port; and a thermistor being connected to the second port, and reflecting the signal being output from the second port by varying the power of the signal according to temperature, so as to input to the second port.

By utilizing the reflection of power produced by the thermistor when the impedance of the thermistor does not match the impedance of a signal transmission line, the power reflection of a signal being input to the circulator is varied with temperature. Thus, the attenuation amount of the signal power output from the circulator is adjusted.

The present gain temperature compensation circuit can suppress the attenuation amount itself while maintaining the variation width of the attenuation amount in a predetermined temperature range, and can reduce the loss (dead loss) of the signal power.

By varying the constant of the thermistor and the impedance of the fixed resistor connected in series or in parallel with the thermistor, it is possible to adjust the thermal inclination to an arbitrary value in the predetermined temperature range.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION EMBODIMENT

Hereinafter, an embodiment of to the present invention will be now explained with reference to accompanying drawings. However, it is not restrictive of technical scope of the invention.

Figure 2:
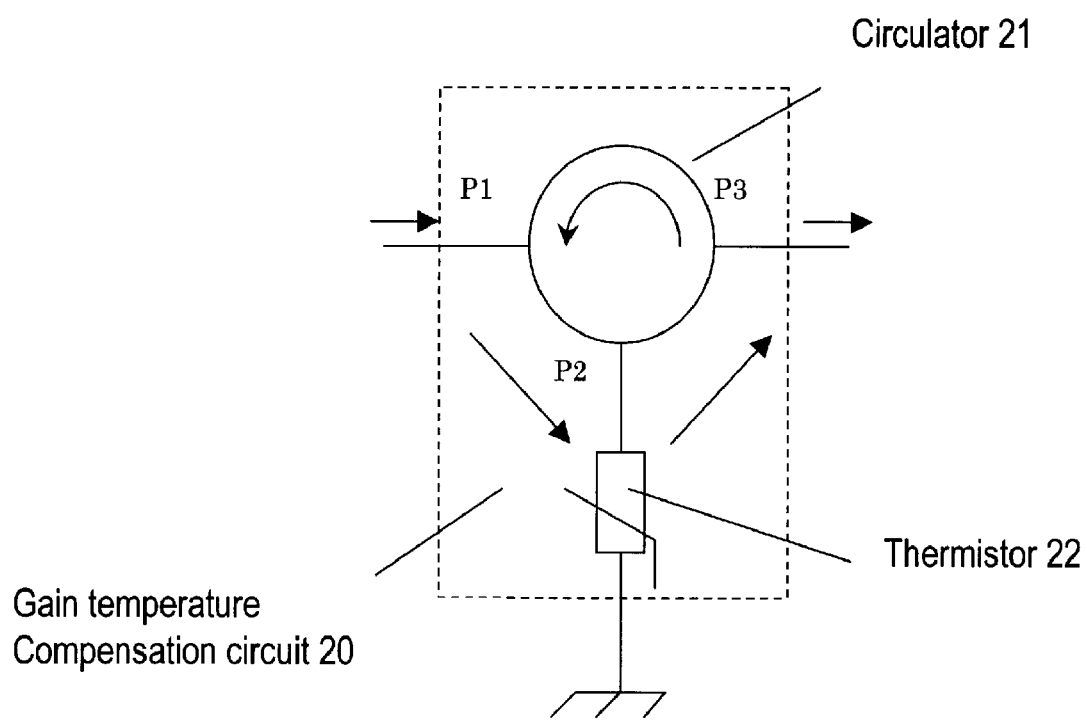
FIG. 2 is a diagram illustrating a first exemplary configuration of a gain temperature compensation circuit according to an embodiment of the present invention.

FIG. 2 is a diagram illustrating a first exemplary configuration of a gain temperature compensation circuit according to an embodiment of the present invention. A gain temperature compensation circuit 20 includes a circulator 21 having three ports, and a thermistor 22. Circulator 21 outputs a signal being input to a first port P1 to a second port P2, and also outputs a signal being input to the second port P2 to a third port P3. Thermistor 22 is connected to the second port P2, and the second port P2 is grounded via thermistor 22.

At this time, if the impedance of the transmission line of a high frequency signal does not match the impedance of the thermistor, the signal being input to the first port P1 and output from the second port P2 is reflected by thermistor 22. Using the above characteristic, gain temperature compensation circuit 20 varies the attenuation amount of the high frequency signal caused by a varied impedance of thermistor 22 according to a temperature change. The reflected high frequency signal is input to the second port P2, and output from the third port P3. By this, it is possible to vary the attenuation amount of the high frequency signal passing through circulator 21 on the transmission line.

Figure 3A:
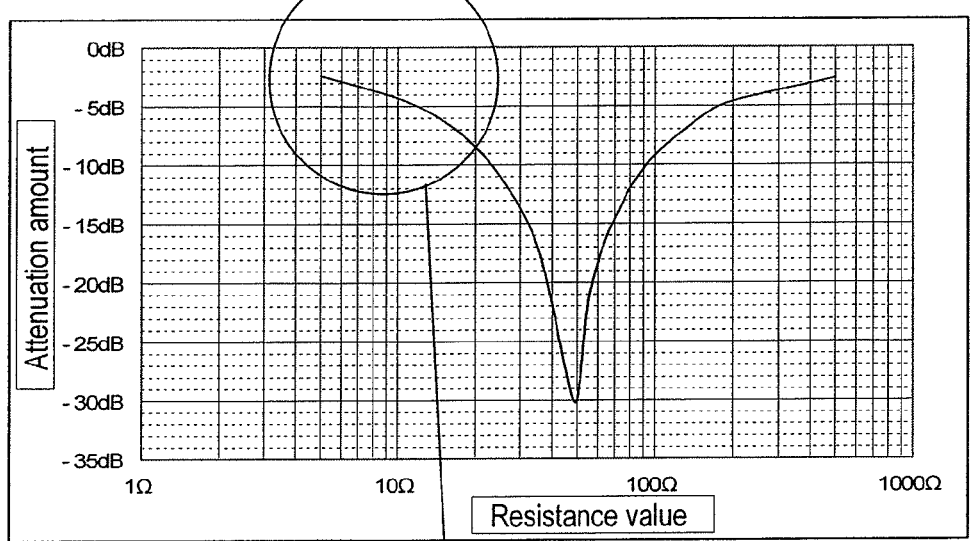
FIG. 3 is a diagram illustrating the change of the attenuation amount of thermistor 22.

FIG. 3 is a diagram illustrating the change of the attenuation amount of thermistor 22. FIG. 3A shows an attenuation amount change relative to the impedance of thermistor 22. In the example shown in FIG. 3A, the impedance of the transmission line is set to be 50Ω. When the impedance of thermistor 22 is set to be 50Ω, the high frequency signal being output from the second port P2 is not reflected at thermistor 22 because of the matched impedance, and flows to the ground direction. Namely, because the high frequency signal is not reflected, the high frequency signal is not output from the third port P3, and the attenuation amount becomes the maximum accordingly. Then, when the impedance of thermistor 22 does not match the impedance of the transmission line, and as the difference between the values becomes greater, the attenuation amount is reduced more. Namely, the power of the reflected high frequency signal becomes increased. At this time, by setting the impedance difference to be a predetermined value or greater, it is possible to virtually make total reflection of the high frequency signal, and to suppress the attenuation amount to be only the passing loss in circulator 21. Assume that the passing loss of circulator 21 is 0.4 dB for example, then by setting the impedance of thermistor 22 to be a value to make total reflection of the high frequency signal, it is possible to suppress the minimum attenuation amount to be 1 dB or less.

Therefore, using thermistor 22 of which impedance varies in an area including the smallest attenuation amount in a predetermined temperature range, as shown by the encircled area in FIG. 3, the thermal inclination of the predetermined attenuation amount in the predetermined temperature range can be secured, and the attenuation amount in the predetermined temperature range can be suppressed to be small.

Figure 3B:
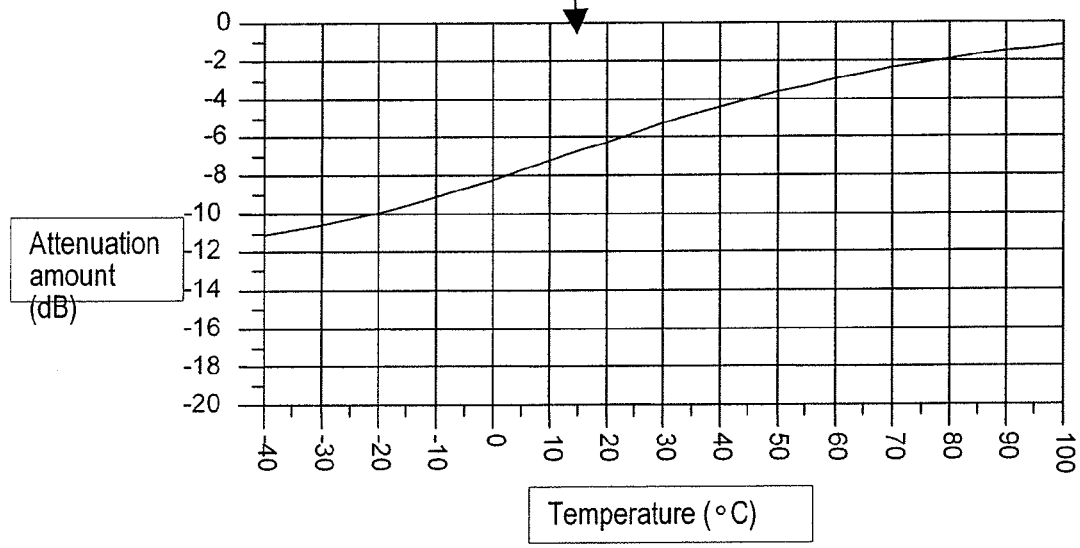

FIG. 3B shows an attenuation amount change corresponding to temperature of thermistor 22. By utilizing the vicinity of an impedance area producing a small attenuation amount (the encircled area shown in FIG. 3A), a desired inclination (10 dB, for example) of the attenuation amount is secured, and also the minimum attenuation amount in the predetermined temperature range can be suppressed to be small. As a result, an attenuation amount in the vicinity of a normal temperature (25° C.) is suppressed (approximately 6 dB, or of that order), and thus, the power loss (dead loss) can be suppressed to a great extent.

Figure 4:
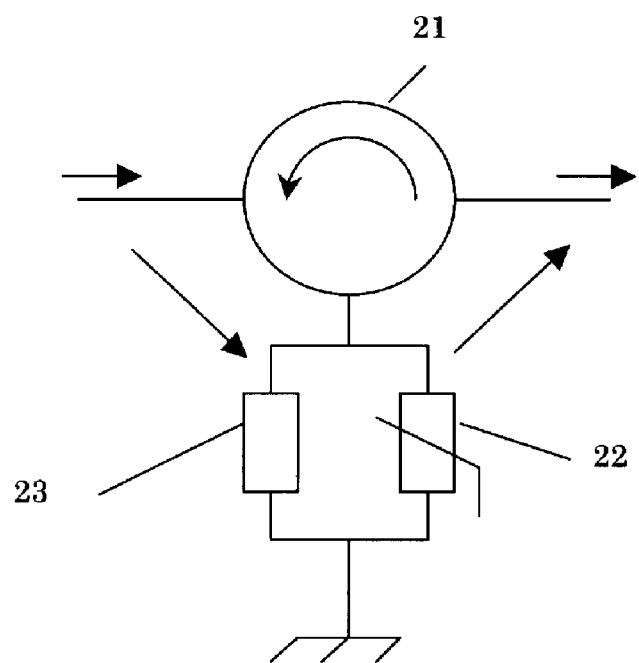
FIG. 4 is a diagram illustrating a second exemplary configuration of the gain temperature compensation circuit according to the embodiment.
Figure 5:
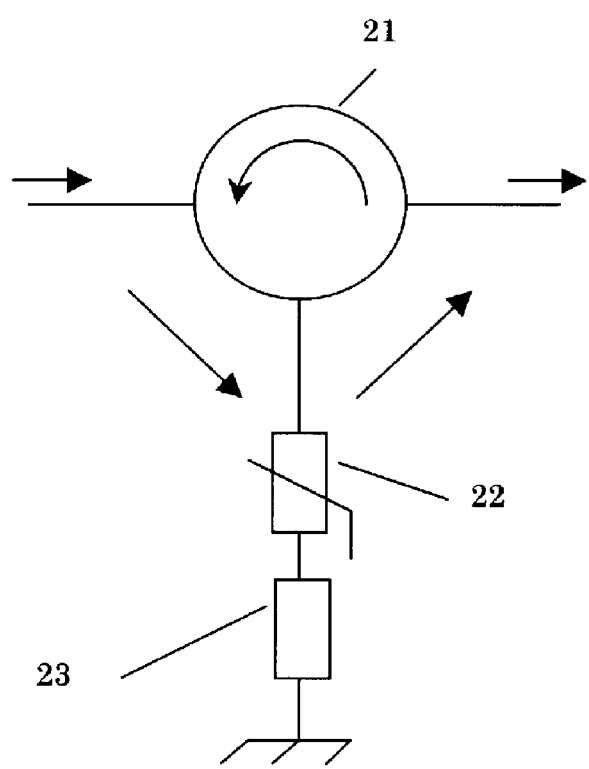
FIG. 5 is a diagram illustrating a third exemplary configuration of the gain temperature compensation circuit according to the embodiment.

FIG. 4 is a diagram illustrating a second exemplary configuration of the gain temperature compensation circuit according to the embodiment, and FIG. 5 is a diagram illustrating a third exemplary configuration. In the example shown in FIG. 4, a fixed resistor 23 is connected in parallel with thermistor 22. Also, in the example shown in FIG. 5, a fixed resistor 23 is connected in series with thermistor 22. In each example, by adjusting a synthesis impedance of thermistor 22 with fixed resistor 23, the thermal inclination (variation width) of the attenuation amount relative to a predetermined temperature range can be set to a desired value. Additionally, the number of fixed resistor 23 to be connected is not limited to one, and a plurality of resistors may be possible. Also, thermistor 22 may be plural in number. In that case, the connection thereof may be made appropriately either in parallel or in series.

Figure 1A:
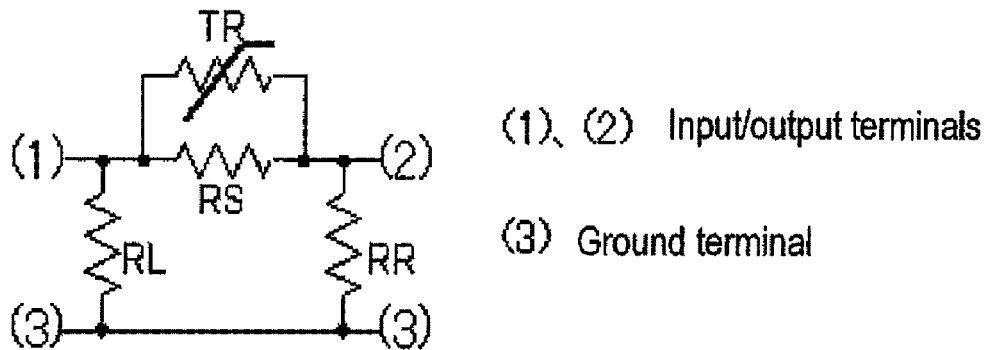
FIG. 1 is a diagram illustrating an exemplary configuration of the conventional gain temperature compensation circuit.
Figure 1B:
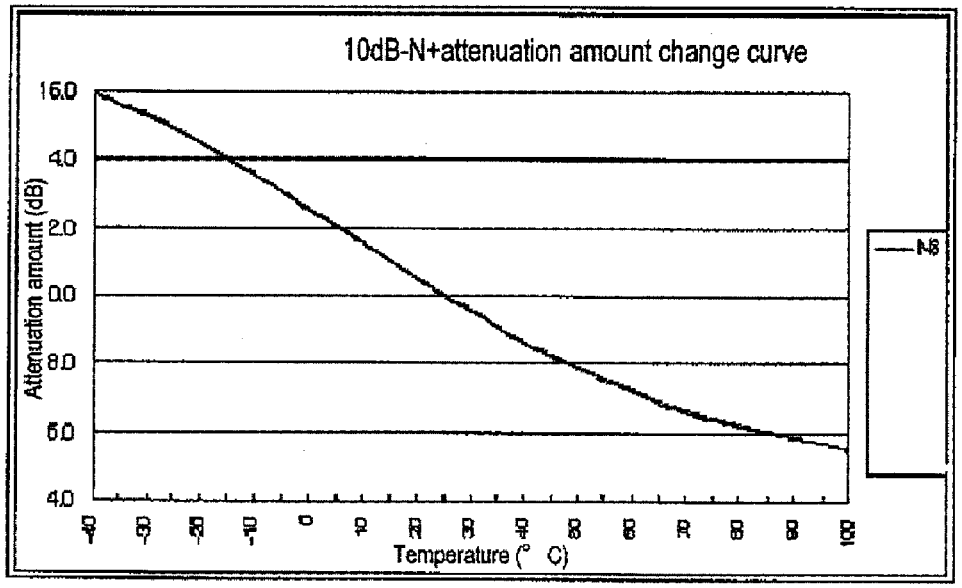
Figure 6:
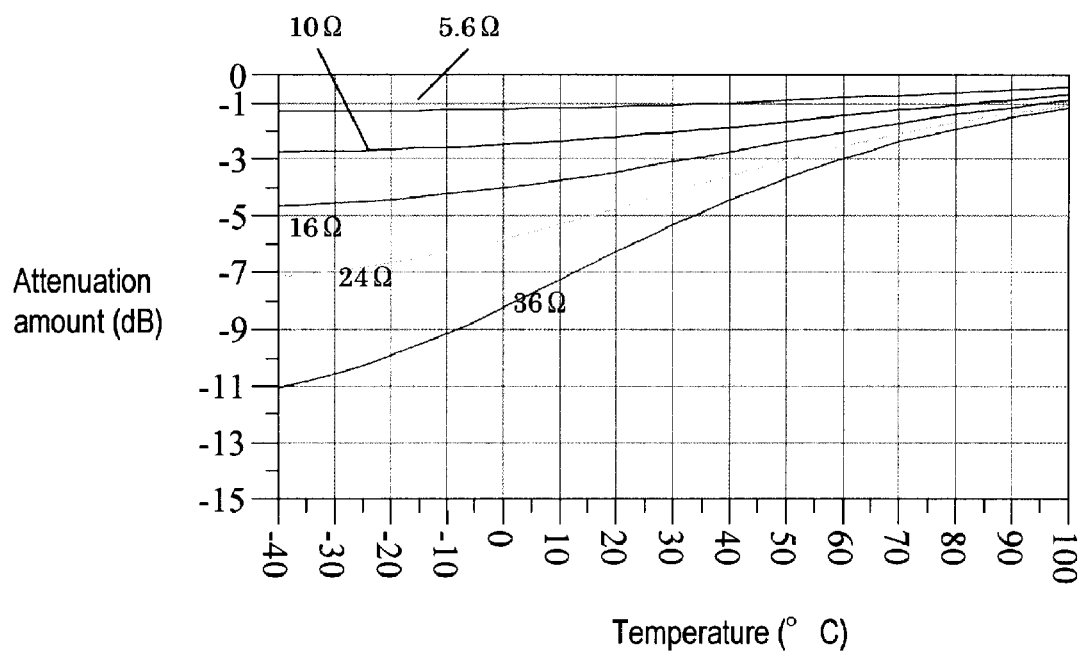
FIG. 6 is a diagram illustrating an attenuation amount change when thermistor 22 is connected in parallel with fixed resistor 23, and the impedance of fixed resistor 23 is varied.

FIG. 6 is a diagram illustrating an attenuation amount change when thermistor 22 is connected in parallel with fixed resistor 23 (the exemplary configuration shown in FIG. 4) and the impedance of fixed resistor 23 is varied. Additionally, the example is a case that the B constant of thermistor 22 is 2,800, on the assumption that the impedance of thermistor 22 in a normal temperature is 40 Ω. Here, the impedance of the transmission line is 50Ω. In FIG. 6, in case of the impedance of the fixed resistor 23 r=36Ω, it is possible to secure the thermal inclination of approximately 10 dB. At that time, the attenuation amount at the normal temperature is approximately 6 dB, or on that order. As compared with the characteristic shown in FIG. 1B, an identical thermal inclination is provided for an identical temperature range, and the power loss thereof can be suppressed to the order of 4 dB.

Also, by modifying the impedance of fixed resistor 23 and the B constant of thermistor 22, it is easily possible to vary to a desired thermal inclination, and therefore, it is possible to flexibly cope with a specification change. Further, it is possible to realize with a simple circuit configuration, without need of a power supply and complicated control.

Because of a suppressed power loss using the present gain temperature compensation circuit, the gain in the power amplifier can be suppressed by that amount. This enables the reduction of transistor circuit components, and simplifies the configuration of the power amplifier.

Figure 7:
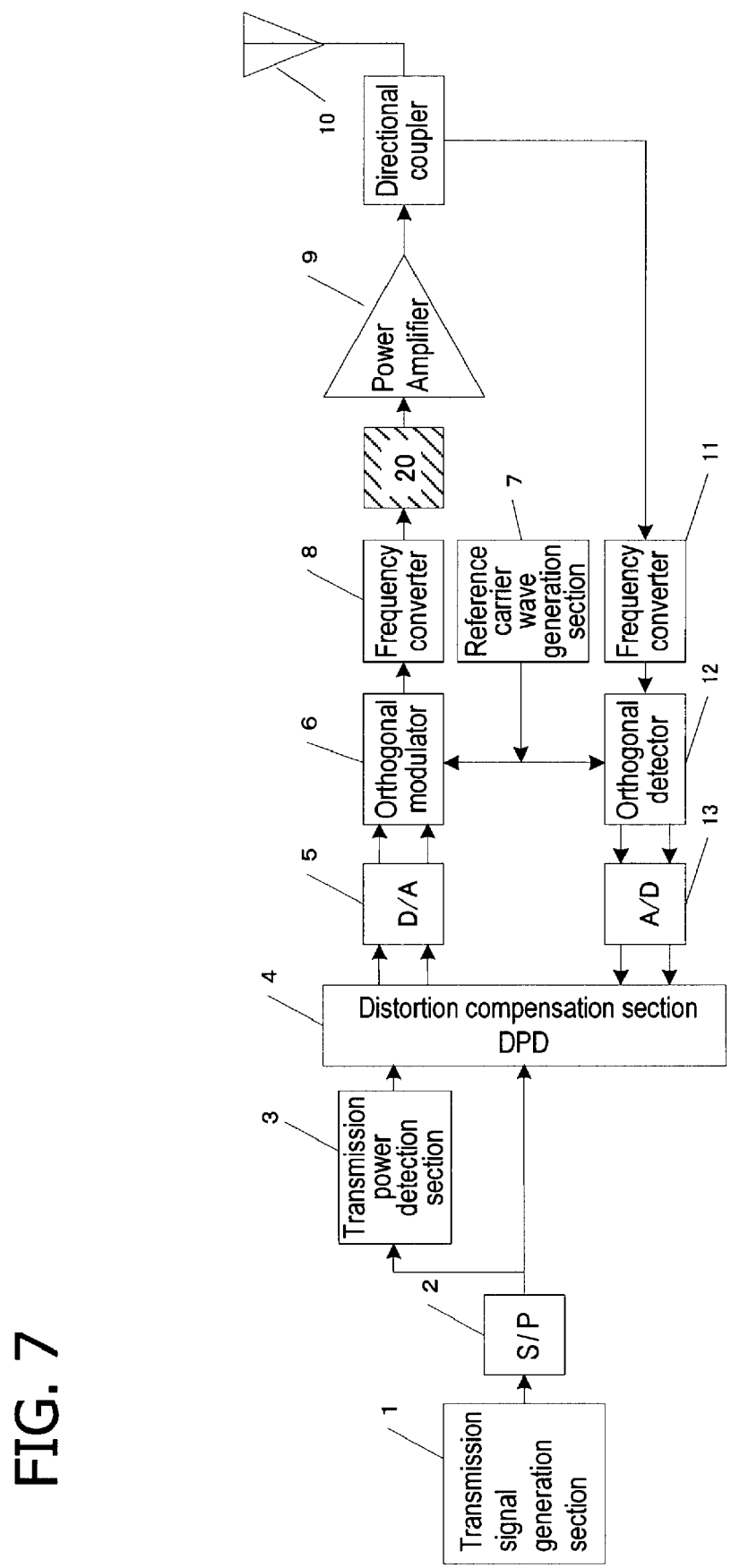
FIG. 7 is a diagram illustrating an exemplary configuration of a radio transmission apparatus to which the present gain temperature compensation circuit is applied.

FIG. 7 is a diagram illustrating an exemplary configuration of a radio transmission apparatus to which the present gain temperature compensation circuit is applied. As one example, the radio transmission apparatus is apparatus for performing radio communication by WiMAX (Worldwide Interoperability for Microwave Access). A transmission signal generation section 1 transmits a serial digital data string, and a serial/parallel converter (S/P converter) 2 converts the digital data string into a parallel string of I-signals and Q-signals. A transmission power detection section 3 calculates power from the input I-signals and Q-signals, performs the decision of low power transmission, and controls a distortion compensation section 4 to start or stop distortion compensation. Based on the transmission signal and a feedback signal, distortion compensation section 4 performs distortion compensation processing by DPD (digital predistortion) processing. The principle of the predistortion system is that an inverse characteristic to the distortion characteristic of the amplifier is added in advance to a signal input to the amplifier, so as to obtain a desired signal having no distortion in the amplifier output. In the predistortion system, a transmission signal before distortion compensation is compared with a demodulated feedback signal, and using the error thereof, a distortion compensation coefficient is calculated and updated. The distortion compensation coefficient is stored in a memory (lookup table), using transmission signal power, or the function thereof, as an address. Then, using the updated distortion compensation coefficient, the predistortion processing is performed on a transmission signal to be transmitted next, and output. By repeating the above operation, finally, the coefficient is converged to an optimal distortion compensation coefficient, and thus, the distortion produced in the transmission power amplifier is compensated.

The signal being DPD processed by distortion compensation section 4 is input to a D/A converter 5, and after I-signals and Q-signals are converted to an analog baseband signal, the output is made to an orthogonal modulator 6. Orthogonal modulator 6 performs multiplication and addition to the input I-signals and Q-signals by signals phase shifted by 90° from the reference carrier wave fed from a reference carrier wave generation section 7, so as to perform orthogonal modulation and output. A frequency converter 8 converts to a radio frequency by mixing the orthogonal modulation signal with a local oscillator signal, and outputs to a gain temperature compensation circuit 20.

Gain temperature compensation circuit 20 performs gain compensation on the transmission signal using the aforementioned function, and outputs the transmission signal to a power amplifier (PA) 9. Power amplifier 9 performs power amplification of the transmission signal, so as to output through an antenna 10. Also, the transmission signal is looped back in the apparatus. After being converted to an IF signal through a frequency converter 11 and an orthogonal detector 12, and passed through an A/D converter 13, the signal is fed back to distortion compensation section 4 as a feedback signal.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A gain temperature compensation circuit comprising:
   a circulator outputting a signal being input to a first port to a second port, and outputting the signal being input to the second port to a third port; and
   a thermistor being connected to the second port, and reflecting the signal being output from the second port by varying the power of the signal according to temperature, so as to input to the second port.

2. The gain temperature compensation circuit according to claim 1, further comprising:
   a resistance element being connected in series or in parallel with the thermistor.

3. A radio transmission apparatus for transmitting a radio signal, comprising:
   a signal generation section for generating a radio signal;
   a gain temperature compensation section attenuating radio signal power generated by the signal generation section according to temperature; and
   a power amplifier amplifying the radio signal having the power attenuated by the gain temperature compensation section,
   the gain temperature compensation section comprising:
   a circulator outputting a signal being input to a first port to a second port, and outputting the signal being input to the second port to a third port; and
   a thermistor being connected to the second port, and reflecting the signal being output from the second port by varying the power of the signal according to temperature, so as to input to the second port.

* * * * *